United States Patent
Kuromiya et al.

[11] Patent Number: 6,034,904
[45] Date of Patent: Mar. 7, 2000

[54] SEMICONDUCTOR MEMORY DEVICE HAVING SELECTION CIRCUIT FOR ARBITRARILY SETTING A WORD LINE TO SELECTED STATE AT HIGH SPEED IN TEST MODE

[75] Inventors: Osamu Kuromiya; Susumu Tanida; Goro Hayakawa, all of Hyogo, Japan

[73] Assignees: Mitsubishi Denki Kabushiki Kaisha; Mitsubishi Electric Engineering Company Limited, both of Tokyo, Japan

[21] Appl. No.: 09/035,989

[22] Filed: Mar. 6, 1998

[30] Foreign Application Priority Data

Sep. 8, 1997 [JP] Japan ................................ 9-242623

[51] Int. Cl.[7] .................................................. G11C 8/00
[52] U.S. Cl. ........................................... 365/201; 365/233
[58] Field of Search ..................................... 365/201, 233

[56] References Cited

U.S. PATENT DOCUMENTS 5,717,652  2/1998  Ooishi .................................... 365/233
5,875,153  2/1999  Hii et al. ................................ 365/233
5,883,843  3/1999  Hii et al. ................................ 365/201

FOREIGN PATENT DOCUMENTS 8-227598  9/1996  Japan .

*Primary Examiner*—David Nelms
*Assistant Examiner*—VanThu Nguyen
*Attorney, Agent, or Firm*—McDermott, Will & Emery

[57] ABSTRACT

A semiconductor memory device includes a control circuit, a test mode control circuit, an internal period setting circuit and an address latch circuit. The control circuit detects whether test mode is designated or not. The test mode control circuit detects whether or not self disturb test mode is designated. The internal period setting circuit repeatedly generates a clock signal of a prescribed period when the test mode and the self disturb test mode are designated. Simultaneously, the address latch circuit latches an address at a fall of a row address strobe signal. The row decoder is activated in response to the clock signal, and repeatedly sets the word line corresponding to the latched address to the selected state.

1 Claim, 10 Drawing Sheets

SEMICONDUCTOR MEMORY DEVICE HAVING SELECTION CIRCUIT FOR ARBITRARILY SETTING A WORD LINE TO SELECTED STATE AT HIGH SPEED IN TEST MODE

BACKGROUND OF THE INVENTION

1. Field of the Invention

The present invention relates to a semiconductor memory device and, more specifically, to a structure allowing high speed testing of a semiconductor memory device. More particularly, the present invention relates to a structure for selecting, at high speed, a word line in a semiconductor memory device at the time of a test operation.

2. Description of the Background Art

Referring to FIG. 8, a conventional semiconductor memory device 200 includes a control circuit 31, an address buffer 34, a memory cell array 7, a row decoder 12 and a column decoder 13.

Memory cell array 7 includes a plurality of word lines, a plurality of bit lines and a plurality of memory cells.

Control circuit 31 receives external control signals /RAS (external row address strobe signal), /CAS (external column address strobe signal), /WE (write enable signal), /OE (external output enable signal) and so on, and generates various internal control signals.

Address buffer 34 receives an internal control signal from control circuit 31 through a control signal bus a3. Address buffer 34 takes in external address signals A0 to Ai applied through an address terminal 8 and outputs an internal row address signal and an internal column address signal-to an internal address bus a4, in response to the applied internal control signal.

Row decoder 12 receives an internal row address strobe signal, which is an internal control signal, from control circuit 31 through control signal bus a3. Row decoder 12 is activated in response to the internal row address strobe signal, and it decodes the internal row address signal output from address buffer 34 and selects a word line of memory cell array 7.

Column decoder 13 receives an internal column address strobe signal from control circuit 31 through control signal bus a2. Column decoder 13 is activated in response to the internal column address strobe signal, and it decodes the internal column address signal output from address buffer 34 and selects a bit line of memory cell array 7.

Semiconductor memory device 200 further includes a sense amplifier, an I/O gate, an input buffer 15 and an output buffer 16. In FIG. 8, the sense amplifier and the I/O gate are generally represented by one block 14.

The sense amplifier receives an internal control signal from control circuit 31 through control signal bus a3. Based on the applied internal control signal, the sense amplifier detects and amplifies data of a memory cell connected to the selected word line of memory cell array 7.

I/O gate connects the selected bit line of memory array 7 to an internal data bus a1 in response to a column selection signal output from column decoder 13.

Input buffer 15 receives an internal control signal from control circuit 31 through a control signal bus a2. Based on the applied internal control signal, input buffer 15 receives external write data DQ0 to DQj applied to data input/output terminal 17, generates an internal write data and transmits the generated internal write data to internal data bus a1.

Output buffer 16 receives an internal control signal from control circuit 31 through control signal bus a2. Based on the applied control signal, output buffer 16 generates, from the internal read data read to internal data bus a1, external read data DQ0 to DQj and outputs the data to data input/output terminal 17.

Internal structure of the memory cell array will be briefly described with reference to FIG. 9. FIG. 9 shows, as a representative, word lines WL0, WL(I−1), WL1, WL(I+1) and a pair of bit lines BL and /BL.

A memory cell M is arranged at a crossing portion between a pair of bit lines and a word line. FIG. 9 shows, as representative, a memory cell M1 arranged at a crossing portion of word line WL(I−1) and bit line /BL, a memory cell M2 arranged at a crossing portion of word line WL1 and bit line BL, and a memory cell M3 arranged at a crossing portion of word line WL(I+1) and bit line /BL.

Each of memory cells M1 to M3 includes a capacitor 50 and an access transistor 51. Capacitor 50 stores information in the form of charges. Access transistor 51 is rendered conductive in response to a potential of a corresponding word line, and connects the corresponding bit line to capacitor 50. Access transistor 51 consists of an N channel MOS transistor.

To a word line selected corresponding to the internal row address signal, a row selection signal is transmitted from row decoder 12. Sense amplifiers included in block 14 are arranged corresponding to respective bit line pairs BL and /BL, and differentially amplify potential of the corresponding bit line pair.

In a reading operation, as the potential of the selected word line increases, potential of a word line which is not selected may possibly float, causing leakage of charges from a capacitor of a memory cell belonging to the non-selected word line to a corresponding bit line.

Generally, capacitor value of a memory cell capacitor is set such that electrode potential of the capacitor would not be significantly decreased even when there is leakage of charges.

However, because of variation in manufacturing, there may be a so-called defective memory cell of which capacitor value is small. In such a defective memory cell, electrode potential of the capacitor is considerably decreased by a minor leakage of charges. This results in inversion of stored data.

Existence of such a defective memory cell is fatal to the operation of the semiconductor memory device.

To cope with this problem, a test for detecting a defective memory cell which causes change in stored data, called disturb test, has been known.

In the disturb test, word lines other than the word line connected to a memory cell of interest are selected for a prescribed number of times (disturb number), and whether the data of the memory cell of interest is retained properly or not (whether the memory cell is defective or not) is determined.

The disturb test in a conventional semiconductor memory device will be described with reference to FIG. 10.

Referring to FIG. 10, at the time of a disturb test, a plurality of semiconductor memory devices DR (in the figure, represented by DR11, . . . , DRmn) are placed on a test board 91. Semiconductor memory device DR is connected to a signal line SG. The signal line SG is connected to a test apparatus 90.

In the disturb test, first, data at an H (logic high) level or an L (logic low) level data is written to semiconductor memory device DR. Thereafter, a clock signal and an external address signal required for selecting a specific word line are applied from test apparatus 90 to signal line SG. In response to the clock signal (more specifically, external control signal /RAS) and the address signal received from signal line SG, semiconductor memory device DR selects a word line.

After repeating the operation of selecting a specific word line for a prescribed number of times, it is determined by test apparatus 90 whether the data of the memory cell of interest is retained properly.

Since the test is performed on the semiconductor memory device in accordance with the procedure described above, the time required for the test depends on the clock signal output from test apparatus 90. Therefore, when the minimum clock length of the signal output from test apparatus 90 is very long, the time required for the test would be very long, especially because the number of test operation is large in the disturb test. Further, only the disturb test of long period is possible by such test apparatus 90. Therefore, correlation with test results obtained by a test apparatus having short minimum clock length cannot be obtained.

A solution is proposed Japanese Patent Laying-Open No. 8-227598 "Semiconductor Storage Device and Its Word Line Selecting Method" in which an address signal for selecting a word line is generated internally. However, according to this proposal, an internally provided address counter selects a word line. Therefore, it is not possible to know from the outside what word line is selected.

SUMMARY OF THE INVENTION

In view of the foregoing, an object of the present invention is to provide a semiconductor memory device which allows a test represented by a disturb test, at a high speed.

Another object of the present invention is to provide a semiconductor memory device which allows external and arbitrary setting of an address to be tested in a test mode.

According to the present invention, a semiconductor memory device comprises a memory cell array including a plurality of memory cells arranged in rows and columns, a test control circuit responsive to a control signal received from outside for generating a test control signal for performing a specific test, a clock generating circuit responsive to the test control signal from the test control circuit for repeatedly generating a clock signal of a prescribed period, and a row selection circuit of which row selecting operation of the memory cell array is activated in response to the clock signal from the clock generating circuit.

Accordingly, an advantage of the present invention is that a memory cell included in the memory cell array can be selected at high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 8:
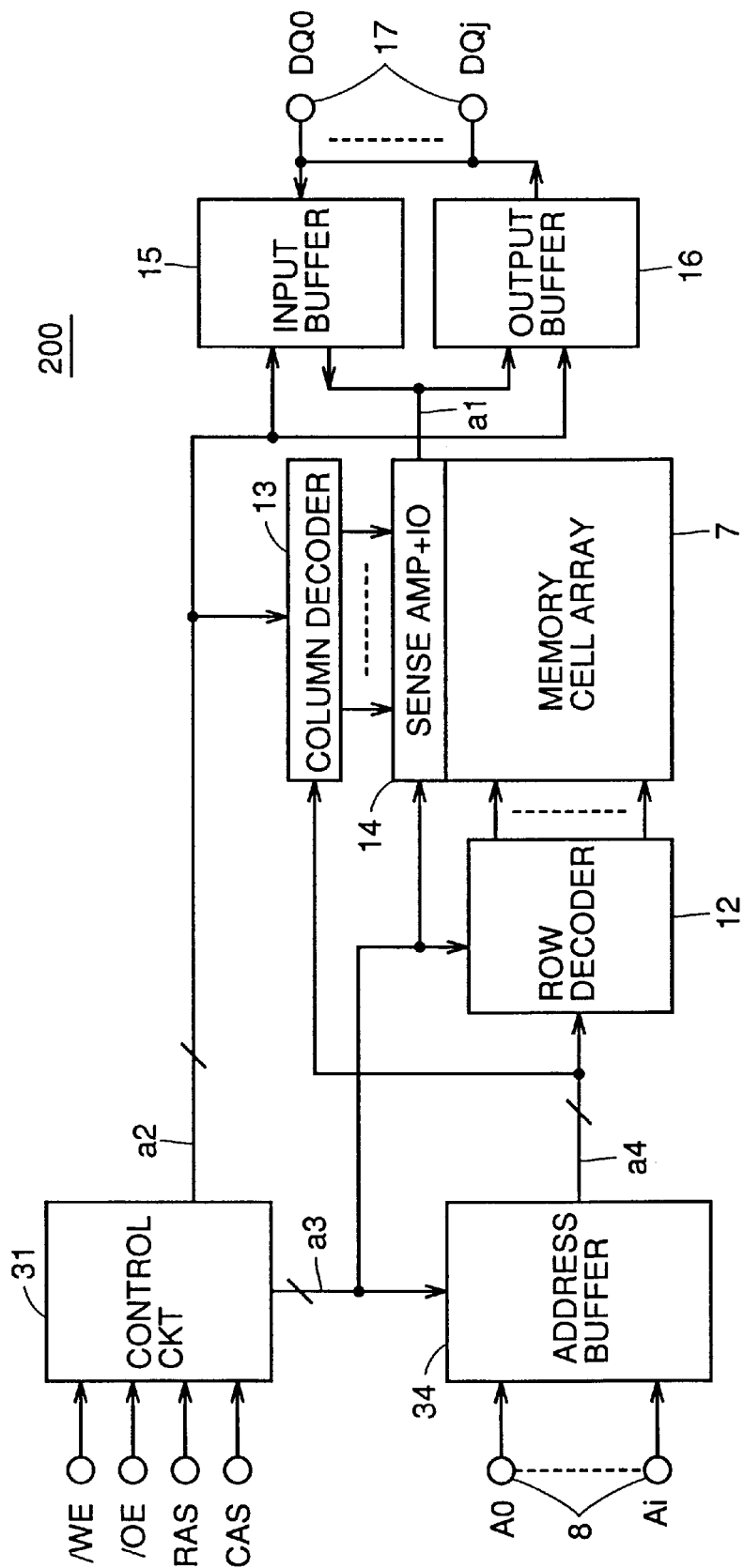
FIG. 8 is a schematic block diagram showing a structure of a main portion of a conventional semiconductor memory device 200.

The structure of a main portion of semiconductor memory device 100 in accordance with the first embodiment of the present invention will be described with reference to FIG. 1. Portions corresponding to those of the conventional semiconductor memory device 200 shown in FIG. 8 are denoted by the same reference characters and description thereof is not repeated.

Figure 1:
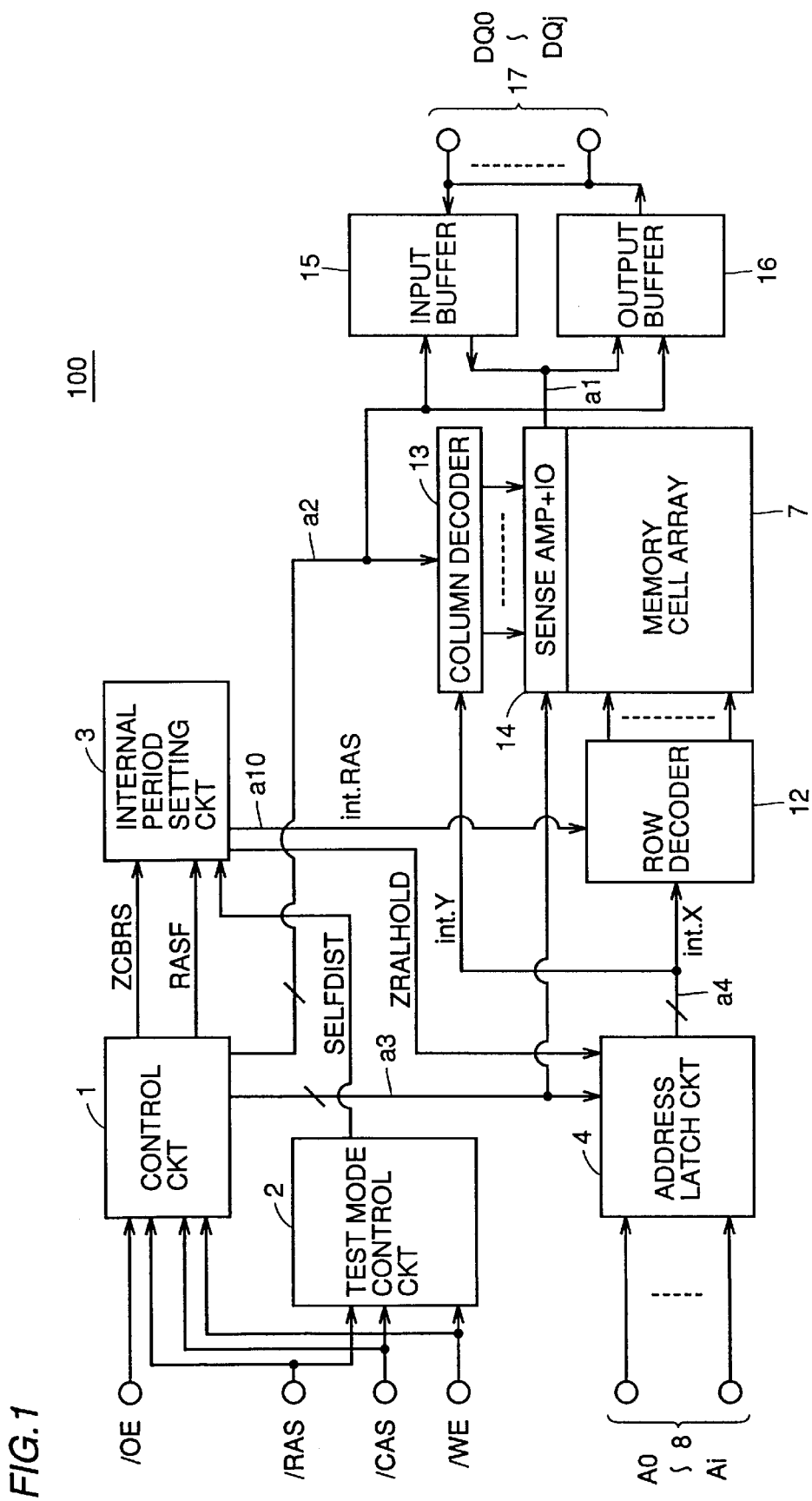
FIG. 1 is a schematic block diagram showing a structure of a main portion of a semiconductor memory device 100 in accordance with a first embodiment of the present invention.

Referring to FIG. 1, semiconductor memory device 100 in accordance with the first embodiment includes a control circuit 1, a test mode control circuit 2, an internal period setting circuit 3 and an address latch circuit 4.

Control circuit 1 receives external control signals /RAS, /CAS, /OE and /WE and generates various internal control signals including a test enable signal ZCBRS and a row selection control signal RASF.

Test enable signal ZCBRS is for executing a test and is set to an active state of H level when a test mode is set, for example. Row selection control signal RASF is in synchronization with external control signal /RAS.

Test mode control circuit 2 receives external control signals /RAS, /CAS and /WE and detects whether a specific test mode, for example a self disturb test mode is entered, and outputs, as a result of detection, a self disturb signal SELFDIST.

Internal period setting circuit 3 outputs internal row address strobe signal int.RAS and an address hold signal ZRALHOLD in response to the test control signal.

Here, the test control signal includes test enable signal ZCBRS and row selection control signal RASF output from control circuit 1, and self disturb signal SELFDIST output from test mode control circuit 2.

Semiconductor memory device 100 in accordance with the first embodiment further includes, in place of an address buffer 34 of conventional semiconductor memory device 200, an address latch circuit 4.

Address latch circuit 4 receives the internal control signal from control circuit 4 through control signal bus a3, and address hold signal ZRALHOLD from internal period setting circuit 3, respectively. In response to these control signals, address latch circuit 4 takes in external address signals A0 to Ai applied through address terminal 8, and outputs internal row address signal int.X and internal column address signal int.Y to internal address bus a4.

Semiconductor memory device 100 further includes a row decoder 12, column decoder 13, a sense amplifier, an I/O gate, input buffer 15 and output buffer 16. In FIG. 1, the sense amplifier and the I/O gate are generally represented by one block 14.

Row decoder 12 receives internal row address strobe signal int.RAS from internal period setting circuit 3 through a control signal bus a10. Row decoder 12 is activated in response to internal row address strobe signal int.RAS, decodes internal row address signal int.X output from address latch circuit 4, and selects a word line of memory cell array 7.

Column decoder 13, input buffer 15 and output buffer 16 receive an internal control signal from control circuit 1 through control signal bus a2. The sense amplifier receives an internal control signal from control circuit 1 through control signal bus a3.

Column decoder 13 is activated in response to the applied internal control signal, decodes internal column address signal int.Y output from address latch circuit 4, and selects a bit line of memory cell array 7.

Figure 9:
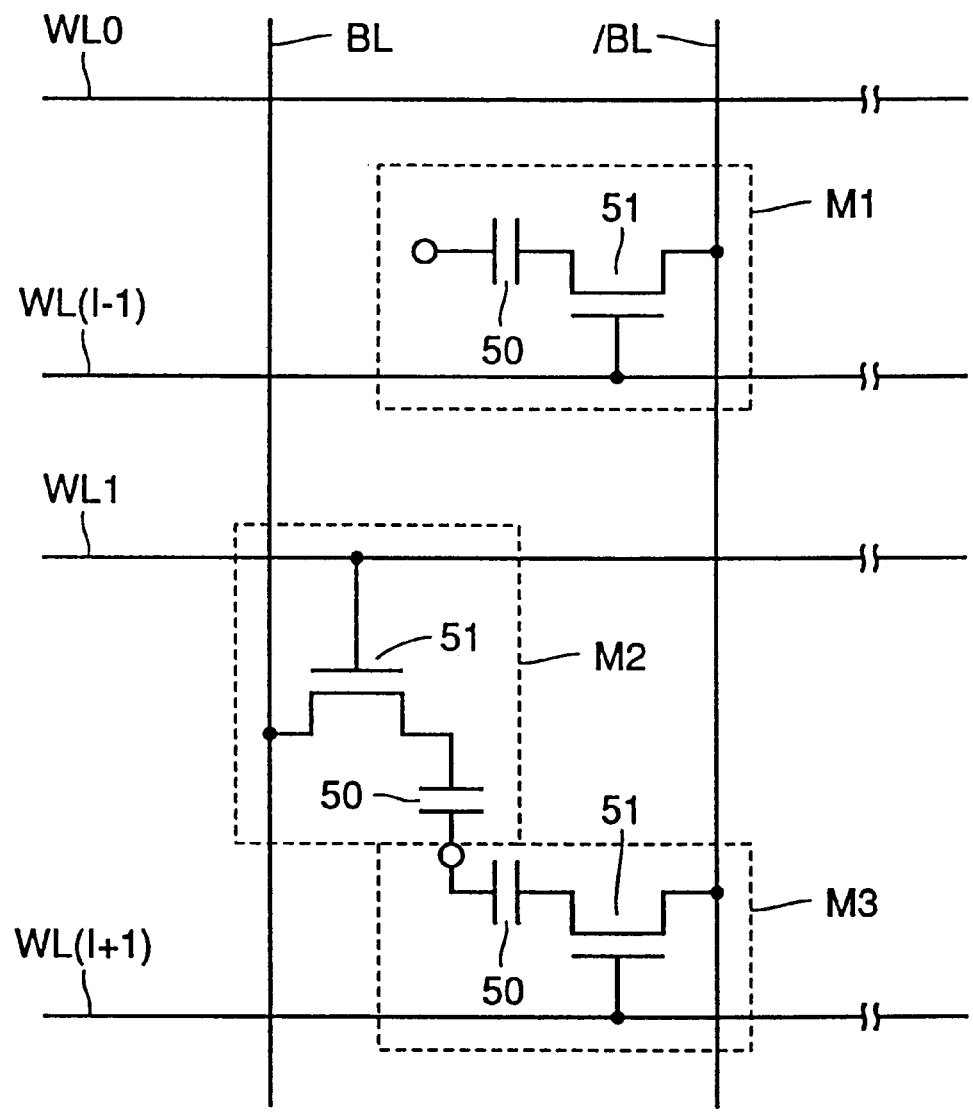
FIG. 9 is a circuit diagram showing internal structure of memory cell array 7 shown in FIG. 8.
Figure 10:
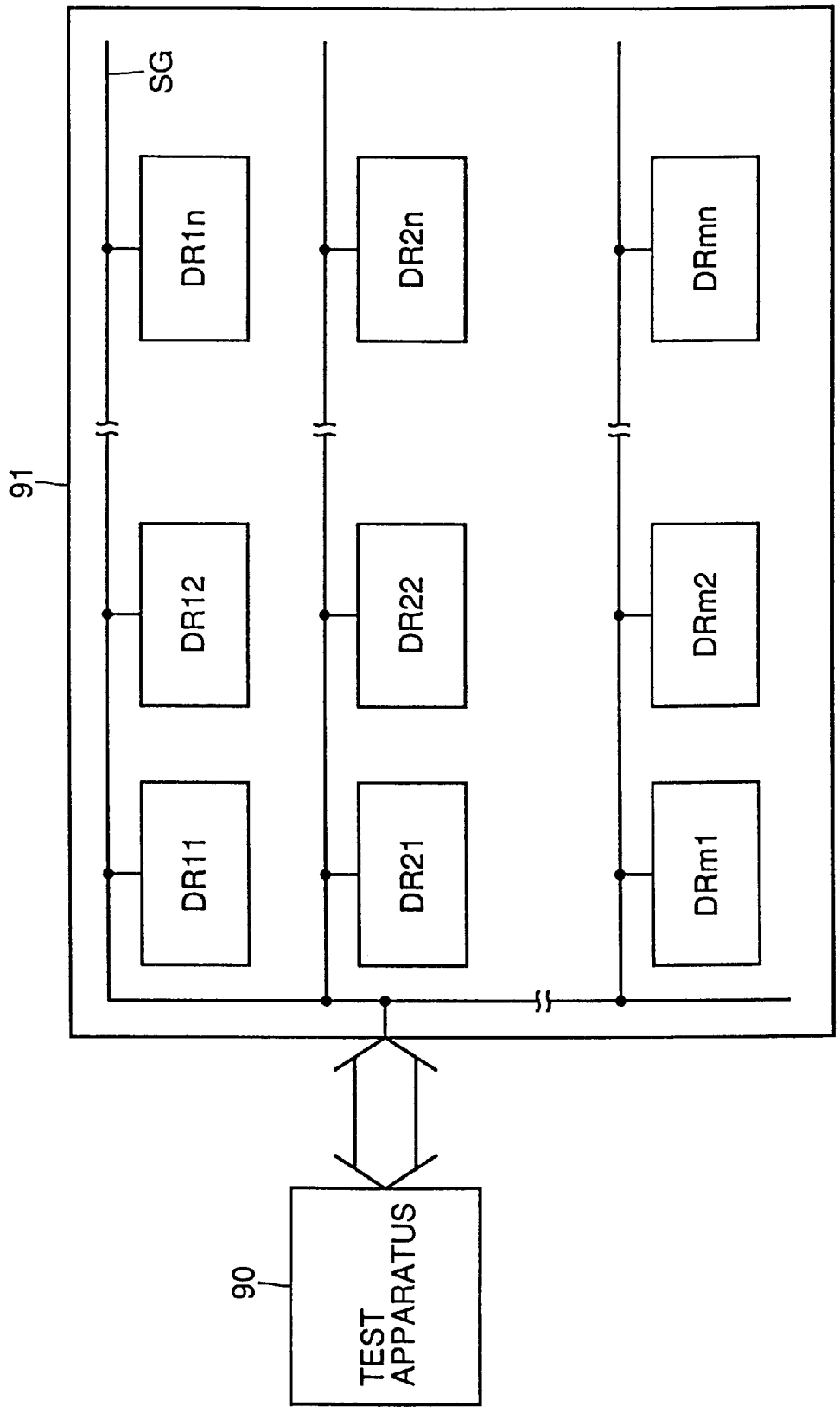
FIG. 10 schematically shows a structure for conducting the disturb test in the conventional semiconductor memory device.

Memory cell array 7 includes, as already described with reference to FIG. 9, a plurality of word lines, a plurality of bit lines and a plurality of memory cells.

The operation of semiconductor memory device 100 in a test mode will be described with reference to timing charts of FIGS. 2A to FIG. 5G.

First, operation in the self disturb test will be described with reference to corresponding timing charts of FIGS. 2A to 3H.

First, from control circuit 1, test enable signal ZCBRS which is at an active state of H level is output in response to the external control signal. The test enable signal ZCBRS is reset to the L level at a specific timing, as will be described later.

Figure 2:
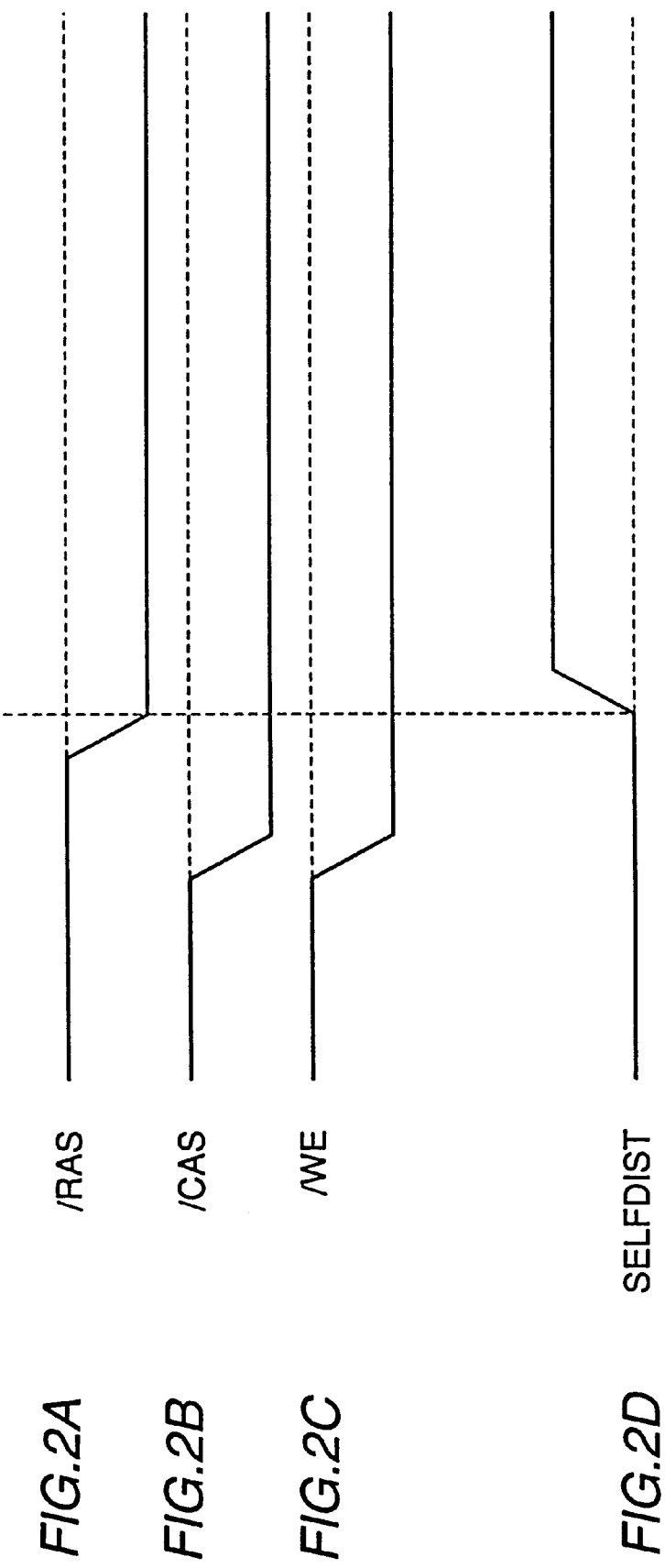
FIGS. 2A to 2D are timing charts representing the operation of semiconductor memory device 100 in a test mode.

In this state, before activation of external control signal /RAS to the L level, for example, external control signals /CAS and /WE are both set to the active state of L level (hereinafter referred to as WCBR cycle), as shown in FIG. 2.

Test mode control circuit 2 detects the WCBR cycle, and outputs self disturb signal SELFDIST which is at an active state of H level. Consequently, among the test modes, the self disturb test mode is designated.

Figure 3:
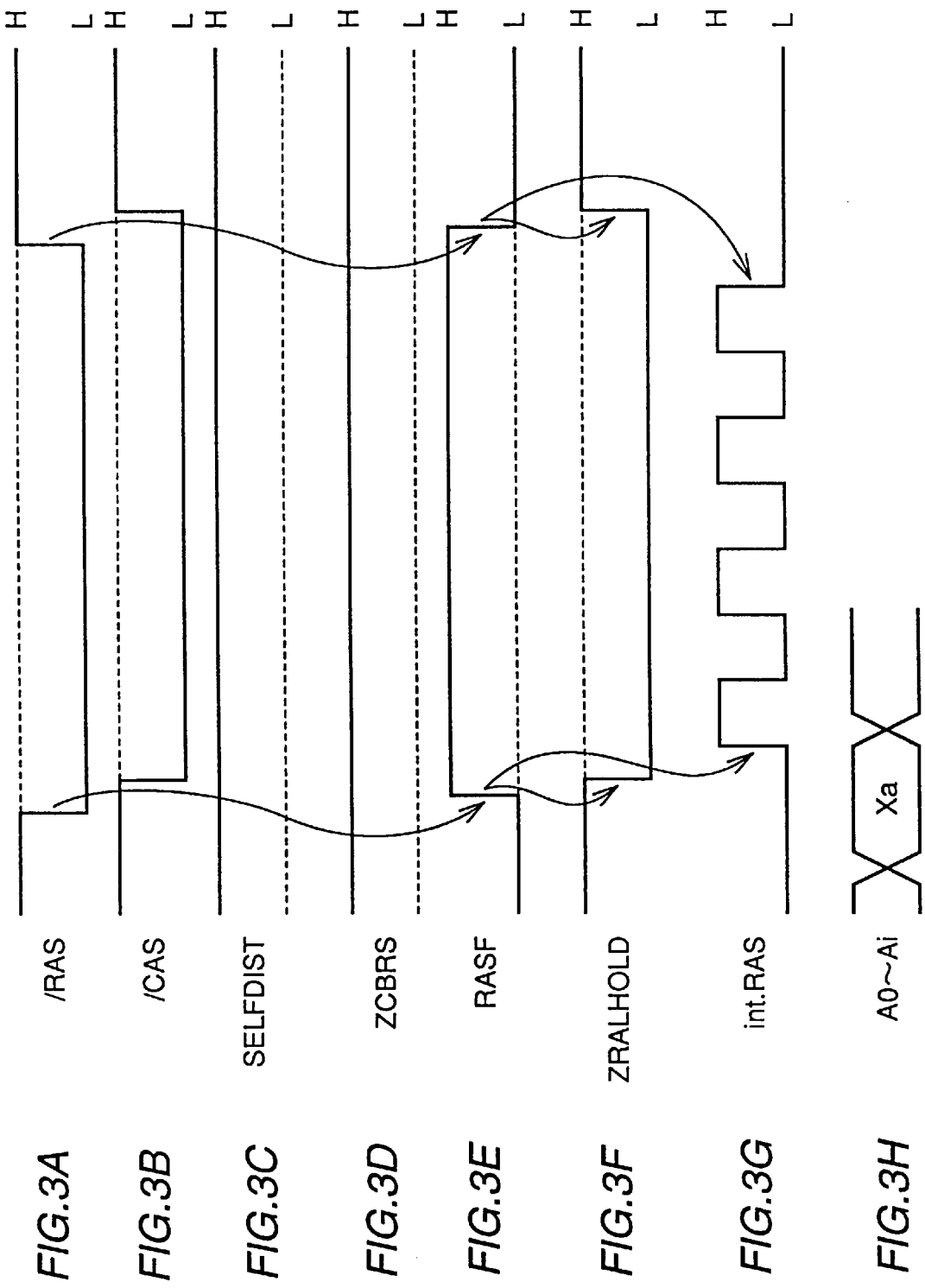
FIGS. 3A to 3H are timing charts representing operation of semiconductor memory device 100 in a test mode.

After setting of WCBR cycle (where self disturb signal SELFDIST is at the H level), external control signal /RAS is set to the active state of L level, and thereafter external control signal /CAS is set to the active state of L level, as shown in FIG. 3 (hereinafter referred to as RAS-CAS cycle). In response, control circuit 1 outputs row selection control signal RASF which is at the active state of H level, in synchronization with external control signal /RAS which is at the L level.

As a result, internal period setting circuit 3 receives self disturb signal SELFDIST at the H level from test mode control circuit 2, and test enable signal ZCBRS at the H level and row selection control signal RASF at the H level from control circuit 1.

Internal period setting circuit 3 outputs address hold signal ZRALHOLD which is at the active state of L level, in synchronization with row selection control signal RASF at the H level.

Internal period setting circuit 3 repeatedly generates the clock signal of a prescribed period, in synchronization with row selection control signal RASF which is at the H level. The clock signal is output to control signal bus a10, and transmitted as internal row address strobe signal int.RAS to row decoder 12.

Address latch circuit 4 receives address hold signal ZRALHOLD at the L level from internal period setting circuit 3. Address latch circuit 4 latches external address signals A0 to Ai taken in at the fall of external control signal /RAS, and outputs internal row address signal int.X (in FIG. 3H, Xa) to internal address bus a4.

Address latch circuit 4 does not take external address signals A0 to Ai until address hold signal ZRALHOLD attains to the H level.

Accordingly, in the self disturb test, row decoder 12 is repeatedly set to the active state in response to the internally generated clock signal (that is, internal row address strobe signal int.RAS), and repeatedly selects the word line corresponding to the external address signals A0 to Ai at the start of the test.

Termination of the self disturb test will be described with reference to the corresponding timing chart of FIGS. 3A to 3H.

Termination of the self disturb test is designated by canceling RAS-CAS cycle as shown in FIGS. 3A to 3H. More specifically, external control signals /RAS and /CAS are set to the H level.

Control circuit 1 outputs row selection control signal RASF of L level in synchronization with external control signal /RAS.

Consequently, internal period setting circuit 3 stops generation of the clock signal, in synchronization with row selection control signal RASF. Internal period setting circuit 3 further outputs address hold signal ZRALHOLD at the H level in synchronization with row selection control signal RASF at the L level.

Address latch circuit 4 receives address hold signal ZRALHOLD which is at the H level from internal period setting circuit 3, and is ready to newly take in external address signals A0 to Ai.

Figure 4:
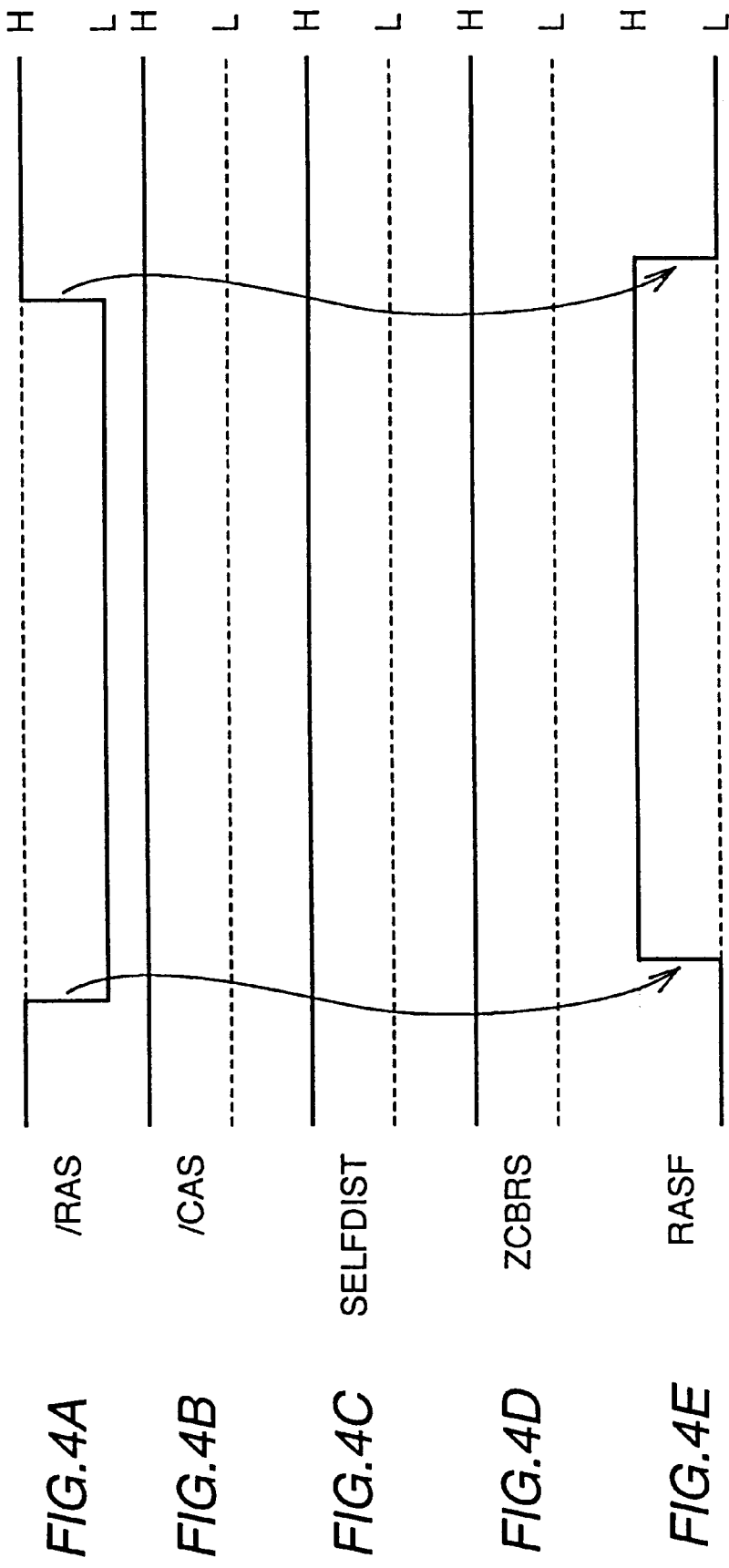
FIGS. 4A to 4E are timing charts representing operation of semiconductor memory device 100 in a test mode.
Figure 5:
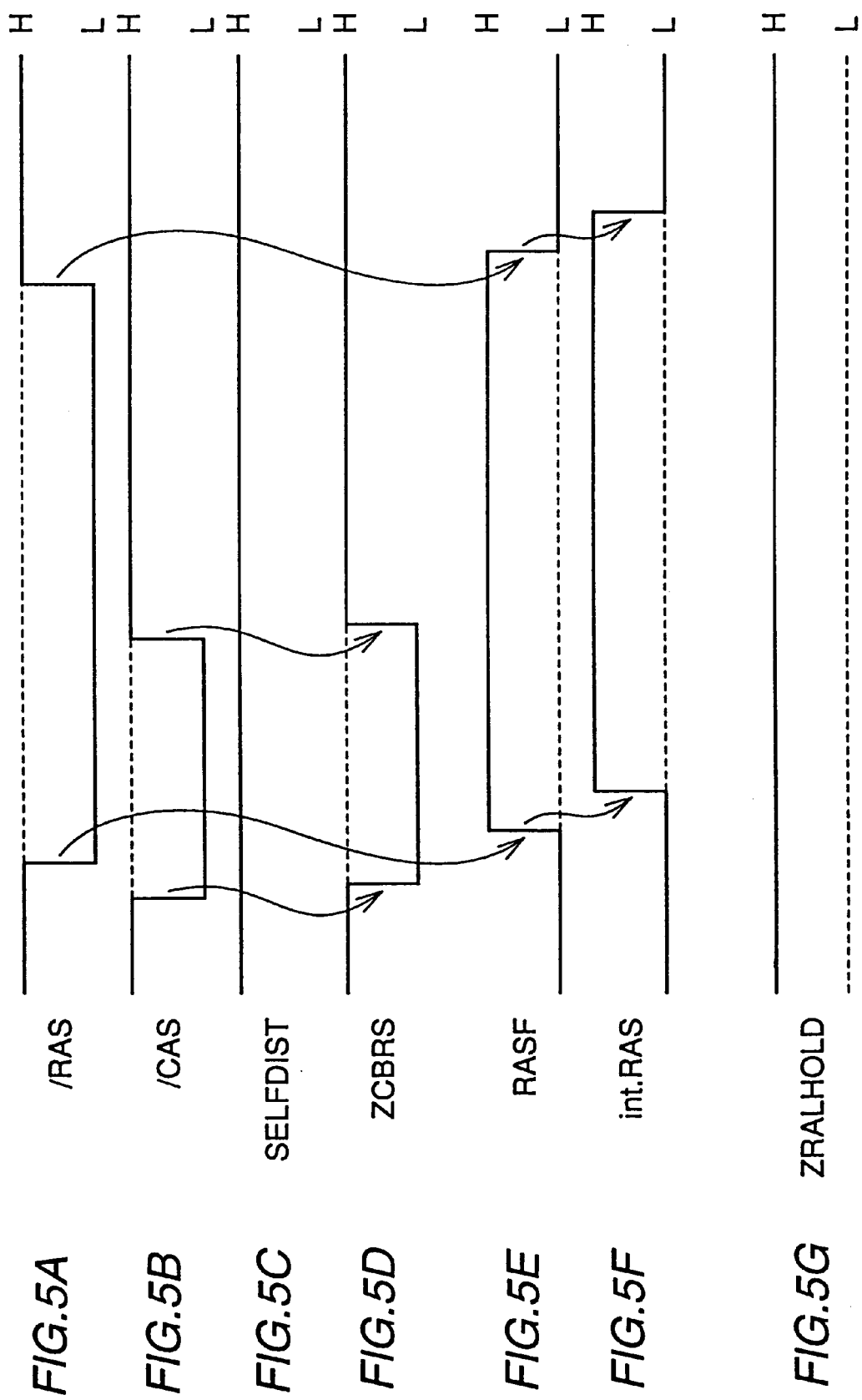
FIGS. 5A to 5G are timing charts representing operation of semiconductor memory device 100 in a test mode.

Different from RAS-CAS cycle shown in FIG. 3, an ROR cycle shown in FIG. 4 (in which external control signal /RAS is set to the active state of L level while external control signal /CAS is maintained at the H level) may be set to execute the self disturb test.

In this case also, internal period setting circuit 3 receives self disturb signal SELFDIST at the H level from test mode control circuit 2, and test enable signal ZCBRS at the H level and row selection control signal RASF at the H level from control circuit 1.

Resetting of the self disturb test will be described with reference to the corresponding time charts of FIGS. 5A to 5G.

It is assumed that test enable signal ZCBRS and self disturb signal SELFDIST are both at the H level.

Referring to FIGS. 5A to 5G, before external control signal /RAS is set to the active state of L level, external control signal /CAS is set to the active state of L level (hereinafter referred to as CBR cycle). Control circuit 1 detects the CBR cycle, and outputs test enable signal ZCBRS at the L level in synchronization with external control signal /CAS which is at the L level. This designates termination of self disturb test.

Control circuit 1 further outputs row selection control signal RASF at the H level in synchronization with external control signal /RAS.

As a result, internal period setting circuit 3 receives self disturb signal SELFDIST which is at the H level from test mode control circuit 2, and receives test enable signal ZCBRS at the L level and row selection control signal RASF at the H level, from control circuit 1.

Consequently, internal period setting circuit 3 outputs internal row address strobe signal int.RAS which is in synchronization with row selection control signal RASF (that is, external control signal /RAS).

Address hold signal ZRALHOLD output from internal period setting circuit 3 is kept at the H level.

Address latch circuit 4 receiving address hold signal ZRASLHOLD at the H level from internal period setting circuit 3 takes in an internal refresh counter address generated by an internal refresh counter (included in address latch circuit 4, for example), which is not shown, in response to an internal control signal received through control signal bus a3, and outputs internal row address signal int.X.

Row decoder 12 is activated in response to external control signal /RAS, and selects a word line corresponding to internal row address signal int.X.

In place of the CBR cycle described above, a cycle may be utilized in which external control signals /CAS and /WE are both set to the active state of L level before activation of external control signal /RAS to the active state of L level (WCBR cycle).

Figure 6:
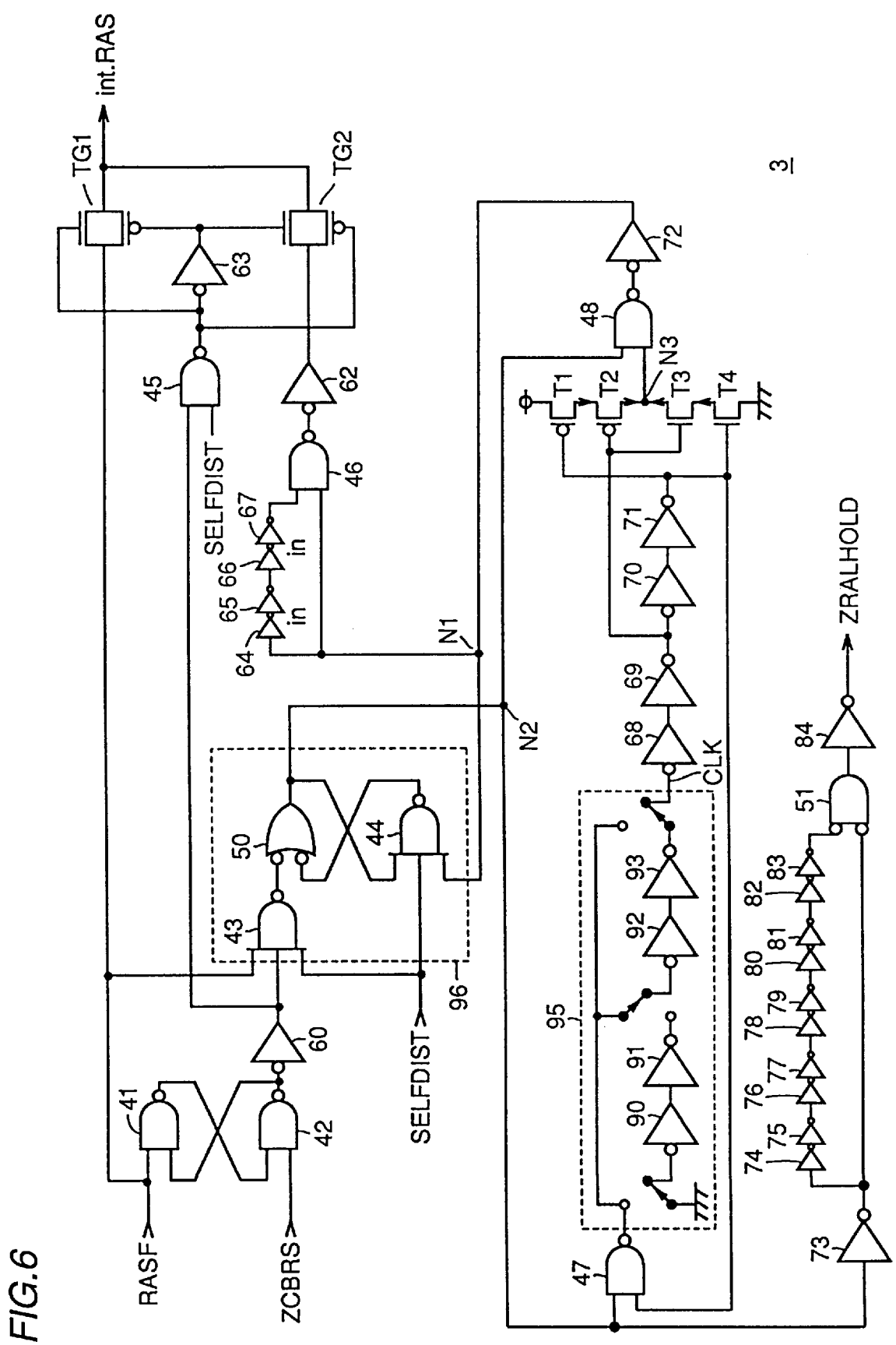
FIG. 6 shows an example of a specific structure of an internal period setting circuit 3 in accordance with the first embodiment.

Specific structure of internal period setting circuit 3 in accordance with the first embodiment will be described with reference to FIG. 6, showing an example.

Referring to FIG. 6, internal period setting circuit 3 includes NAND circuits 41 to 48, inverter circuits 60, 62 to 84 and 90 to 93, a negative logic NAND circuit 50, a negative logic NOR circuit 51, transmission gates TG1 to TG2 and MOS transistors T1 to T4.

Internal period setting circuit 3 receives row selection control signal RASF and test enable signal ZCBRS from control circuit 1, and receives self disturb signal SELFDIST from test mode control circuit 2.

NAND circuit 41 receives, at its inputs, row selection control signal RASF and an output from NAND circuit 42. NAND circuit 42 receives, at its inputs, test enable signal ZCBRS and an output from NAND circuit 41. Inverter circuit 60 inverts an output from NAND circuit 42.

NAND circuit 43 receives, at its inputs, an output from inverter circuit 60, row selection control signal RASF and self disturb signal SELFDIST.

Negative logic NAND circuit 50 receives, at its inputs, outputs from NAND circuits 43 and 44. NAND circuit 44 receives, at its inputs, self disturb signal SELFDIST, a signal at node N2 (output from negative logic NAND circuit 50) and a signal at node N1 (output from inverter circuit 72). NAND circuit 43, negative logic NAND circuit 50 and NAND circuit 44 constitute a latch circuit 96.

Inverter circuits 64 to 67 are connected in series between NAND circuit 46 and node N1. NAND circuit 46 receives, at its inputs, an output from inverter circuit 67 and a signal at node N1. Inverter circuit 62 inverts an output from NAND circuit 46.

NAND circuit 45 receives, at its inputs, an output from inverter 60 and self disturb signal SELFDIST. Inverter circuit 63 inverts an output form NAND circuit 45.

Transmission gate TG1 is connected between an input node receiving row selection control signal RASF and an output node outputting internal row address strobe signal int.RAS, and is rendered conductive in response to an output from NAND circuit 45 and an output inverter circuit 63.

Transmission gate TG2 is connected between an output node of inverter circuit 62 and the output node outputting internal row address strobe signal int.RAS, and is rendered conductive in response to outputs from NAND circuit 45 and inverter circuit 63.

NAND circuit 47 receives, at its input, a signal at node N2 and an output from inverter circuit 71. Inverter circuits 90 to 93 arranged between NAND circuit 47 and inverter circuit 68 constitute a ring oscillator 95. Ring oscillator 95 outputs clock signal CLK, controlled by NAND circuit 47. The number of stages of the inverter circuits constituting ring oscillator 95 is adjusted in advance.

Inverter circuits 68 to 71 are connected in series to an output node of ring oscillator 95. An output node of inverter circuit 69 is connected to gate electrodes of MOS transistors T2 and T3. An output of inverter circuit 71 is connected to gate electrodes of MOS transistors T1 and T4.

MOS transistor T1 has one conduction terminal connected to an external power supply voltage VCC. MOS transistor T4 has one conduction terminal connected to ground potential GND. Here, MOS transistors T1 and T2 are P channel MOS transistors and MOS transistors T3 and T4 are N channel MOS transistors.

Potential of node N3, which is a connection node between MOS transistors T2 and T3 attains to the H or L level in accordance with the clock signal CLK output from ring oscillator 95.

NAND circuit 48 receives at its inputs signals on nodes N3 and N2. Inverter circuit 72 inverts an output from NAND circuit 48.

Further, inverter circuits 73 inverts the signal at node N2. Inverter circuits 74 to 83 are connected in series to an output node of inverter circuit 73. Negative logic NOR circuit 51 receives at its inputs, outputs from inverter circuits 83 and 73. Inverter circuit 84 inverts an output from negative logic NOR circuit 51. Inverter circuit 84 outputs address hold signal ZRALHOLD.

With the circuit structured as described above, when self disturb signal SELFDIST is at the L level or when test enable signal ZCBRS attains to the L level, a signal in synchronization with row selection control signal RASF (a signal in synchronization with external control signal /RAS) is output through transmission gate TG1.

When test enable signal ZCBRS and self disturb signal SELFDIST are at the H level, a clock signal of a prescribe period is generated by ring oscillator 95. The clock signal at node N1 is output through transmission gate TG2.

Relation between each of internal row address strobe signal int.RAS and address hold signal ZRALHOLD with respect to row selection control signal RASF will be described with reference to the corresponding timing charts of FIGS. 7A to 7D.

As shown in FIGS. 7A to 7D, in the self disturb test, row selection control signal RASF attains to the H level in response to external control signal /RAS, and clock signals c1, c2, . . . , c4 are generated as internal row address strobe signal int.RAS.

Figure 7:
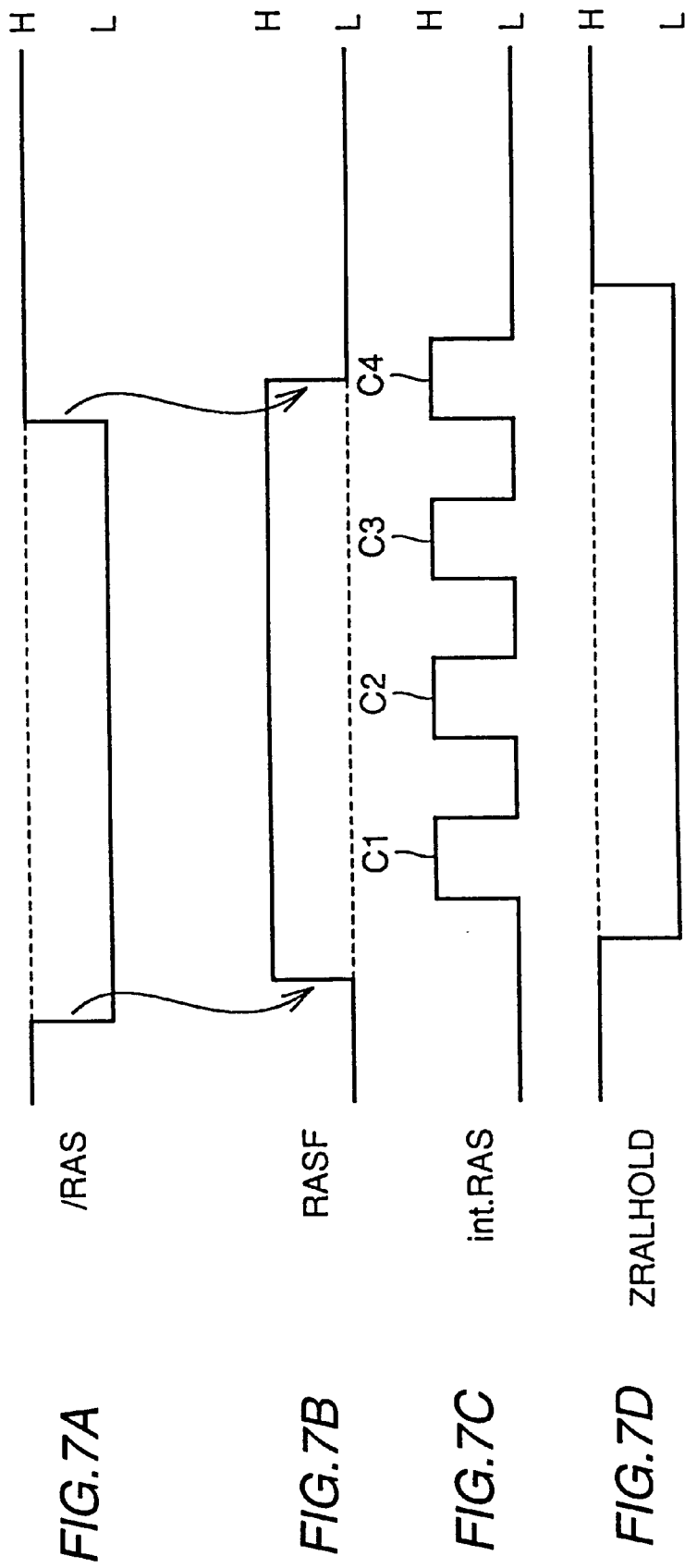
FIGS. 7A to 7D are timing charts representing relation between each of internal row address strobe signal int.RAS and an address hold signal ZRALHOLD with respect to a row selection control signal RASF.

Assume that row selection control signal RASF attains to the L level in response to external control signal /RAS while clock signal C4 is at the H level. In this case, the activation time of clock signal c4 is ensured as shown in FIG. 7, as latch circuit 96 shown in FIG. 6 is provided. Accordingly, active period of address hold signal ZRALHOLD is also ensured. Therefore, malfunction caused by unsatisfactory internal row address strobe signal can be prevented.

As described above, in the semiconductor memory device in accordance with the present invention, it is possible to generate a clock signal of short cycle internally, in a specific test mode represented by the self disturb test. Therefore, in a test mode requiring a large test number, the test time can be reduced.

Further, even in a test apparatus capable of generating a clock signal of a long period only, it is possible to perform disturb test with short cycle in the device. Therefore, test results can be correlated with test result provided by a test apparatus which is capable of generating a clock signal of a short period.

Further, in the semiconductor memory device in accordance with the present invention, it is possible to latch an external address in the test mode. Therefore, it is possible to repeat testing in accordance with an externally applied arbitrary address.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array of plurality of memory cells arranged in rows and columns, test control means responsive to an externally applied control signal for generating a test control signal for performing a specific test;

clock generating means responsive to the test control signal from said test control means for repeatedly generating a clock signal of a prescribed period row selection means, being activated in response to said clock signal from said clock generating means for performing row selecting operation of said memory array; and latch means for latching an internal address signal corresponding to an address externally applied at the start of said specific test, for a period of said specific test; wherein said row selection means is activated in response to said clock signal and Performs selecting operation of repeatedly selecting a row of said memory cell array that corresponds to said latched internal address signal.

* * * * *